United States Patent
Kotani et al.

(10) Patent No.: US 8,108,824 B2
(45) Date of Patent: Jan. 31, 2012

(54) PATTERN VERIFICATION METHOD, METHOD OF MANUFACTURING SEMICONDUCTOR DEVICE, AND RECORDING MEDIA

(75) Inventors: Toshiya Kotani, Tokyo (JP); Hiromitsu Mashita, Kanagawa (JP); Kazuhito Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 391 days.

(21) Appl. No.: 12/420,931

(22) Filed: Apr. 9, 2009

(65) Prior Publication Data
US 2009/0258446 A1  Oct. 15, 2009

(30) Foreign Application Priority Data
Apr. 10, 2008  (JP) ................. 2008-102381

(51) Int. Cl.
*G06F 17/50* (2006.01)
(52) U.S. Cl. .......... 716/139; 716/55; 716/111; 716/119; 716/132
(58) Field of Classification Search .................. 716/55, 716/119, 132, 139
See application file for complete search history.

(56) References Cited

U.S. PATENT DOCUMENTS

| | | | | |
|---|---|---|---|---|
| 6,913,861 | B2 * | 7/2005 | Shishido et al. | 430/30 |
| 7,120,882 | B2 * | 10/2006 | Kotani et al. | 716/53 |
| 7,240,307 | B2 | 7/2007 | Aoyama et al. | |
| 2007/0061772 | A1 | 3/2007 | Ye et al. | |

FOREIGN PATENT DOCUMENTS

| | | |
|---|---|---|
| JP | 2003-241364 | 8/2003 |
| JP | 2004-126486 | 4/2004 |

* cited by examiner

*Primary Examiner* — Thuan Do
(74) *Attorney, Agent, or Firm* — Finnegan, Henderson, Farabow, Garrett & Dunner, L.L.P.

(57) ABSTRACT

A pattern verification method according to an embodiment includes, dividing a pattern data region or a pattern formation region formed based on the pattern data to a plurality of unit regions, calculating a pattern area ratio with respect to each unit region, calculating differences in the amount of the pattern area ratio between each unit region and adjacent unit regions thereto, setting the number or density of measurement point with respect to each unit region to the pattern of the pattern data region or the pattern formation region according to the difference in the amount of pattern area ratio, measuring the pattern size at each measurement point, and verifying whether the size measurement value is within a predetermined range or not.

20 Claims, 10 Drawing Sheets

FIG.4

12 MEMORY CELL REGION

| 100 | 100 | 100 | 100 | 100 | 100 | 100 |
|-----|------|-----|-----|-----|------|-----|
| 100 | 87.5 | 75  | 75  | 75  | 87.5 | 100 |
| 100 | 75   | 50  | 50  | 50  | 75   | 100 |
| 100 | 75   | 50  | 50  | 50  | 75   | 100 |
| 100 | 75   | 50  | 50  | 50  | 75   | 100 |
| 100 | 87.5 | 75  | 75  | 75  | 87.5 | 100 |
| 100 | 100  | 100 | 100 | 100 | 100  | 100 |

20 MESH REGION

FIG. 5B

| | | |
|---|---|---|
| i | h | g |
| b | a | f |
| c | d | e |

| | | |
|---|---|---|
| a-i | a-a | a-h |
| a-b | | a-g |
| a-c | a-d | a-e |

20 MESH REGION, 21 SEGMENT

| | | | | | | | | | | | | | | | | | | |
|---|---|---|---|---|---|---|---|---|---|---|---|---|---|---|---|---|---|---|
|100|100|100|100|100|100|100|100|100|100|100|100|100|100|100|100|100|100|100|
|100|0|0|0|0|0|0|0|0|0|0|0|0|0|0|0|0|0|100|
|100|0|13|0|13|25|13|25|25|25|25|25|25|25|13|25|13|0|13|0|100|
|100|0|0|-13|-13|-13|-25|-25|-25|-25|-25|-25|-25|-13|-13|-13|0|0|100|
|100|0|13|-13|0|13|-13|0|-13|0|-13|0|-13|13|0|13|0|13|0|100|
|100|0|25|-13|13|0|38|0|25|25|25|25|25|25|0|38|13|-13|25|13|0|100|
|100|0|13|-13|0|-13|0|-38|0|-25|-25|-25|-25|-25|-38|0|-13|-25|13|0|100|
|100|0|25|-25|25|0|-25|0|25|0|0|0|0|0|-25|25|0|-25|25|0|100|
|100|0|25|-25|0|25|-25|0|0|0|0|0|0|-25|0|25|-25|0|25|0|100|
|100|0|25|-25|0|25|-25|0|0|0|0|0|0|-25|0|25|-25|0|25|0|100|
|100|0|25|-25|0|25|-25|0|0|0|0|0|0|-25|0|25|-25|0|25|0|100|
|100|0|25|-25|25|0|-25|0|25|0|0|0|0|0|-25|25|0|-25|25|0|100|
|100|0|13|-13|0|-13|0|-38|0|-25|-25|-25|-25|-25|-38|0|-13|-25|13|0|100|
|100|0|25|-13|13|0|38|0|25|25|25|25|25|25|0|38|13|-13|25|13|0|100|
|100|0|13|-13|0|13|-13|0|-13|0|-13|0|-13|13|0|13|0|13|0|100|
|100|0|0|-13|-13|-13|-25|-25|-25|-25|-25|-25|-25|-13|-13|-13|0|0|100|
|100|0|13|0|13|25|13|25|25|25|25|25|25|25|13|25|13|0|13|0|100|
|100|0|0|0|0|0|0|0|0|0|0|0|0|0|0|0|0|0|100|
|100|100|100|100|100|100|100|100|100|100|100|100|100|100|100|100|100|100|100|

FIG.6

| | | | | | | | |
|---|---|---|---|---|---|---|---|
| | 50.00 | 57.28 | 61.24 | 57.28 | 50.00 | | ⟩ 20 MESH REGION |
| | 57.28 | 62.50 | 43.30 | 62.50 | 57.28 | | |
| | 61.24 | 43.30 | 0.00 | 43.30 | 61.24 | | |
| | 57.28 | 62.50 | 43.30 | 62.50 | 57.28 | | |
| | 50.00 | 57.28 | 61.24 | 57.28 | 50.00 | | |
| | | | | | | | |

FIG.8A

| 85 | 85 | 85 | 85 | 90 | 100 | 100 |
|----|----|----|----|----|-----|-----|
| 70 | 70 | 70 | 85 | 75 | 75 | 75 |
| 70 | 70 | 70 | 70 | 60 | 60 | 60 |
| 70 | 70 | 70 | 60 | 60 | 60 | 60 |
| 85 | 85 | 85 | 70 | 60 | 60 | 60 |
| 100 | 90 | 85 | 87.5 | 75 | 75 | 75 |
| 100 | 100 | 90 | 100 | 100 | 100 | 100 |

20 MESH REGION

FIG.8B 20     21 SEGMENT

| 85 | 85 | 85 | 85 | 85 | 85 | 85 | 85 | 85 | 85 | 85 | 85 | 90 | 90 | 90 | 100 | 100 | 100 | 100 | 100 | 100 |
|----|----|----|----|----|----|----|----|----|----|----|----|----|----|----|-----|-----|-----|-----|-----|-----|
| 85 | 0 | 0 | 0 | 0 | 0 | 0 | 0 | 0 | 0 | 0 | -5 | 5 | 0 | -10 | 10 | 0 | 0 | 0 | 0 | 100 |
| 85 | 15 | 15 | 15 | 15 | 15 | 15 | 15 | 0 | 15 | 0 | 10 | 5 | 15 | 15 | 25 | 25 | 25 | 25 | 25 | 100 |
| 70 | -15 | -15 | -15 | -15 | -15 | -15 | -15 | 0 | 0 | -5 | -10 | -15 | -25 | -15 | -25 | -25 | -25 | -25 | -25 | 75 |
| 70 | 0 | 0 | 0 | 0 | 0 | 0 | 0 | -15 | 15 | 0 | 10 | -10 | 0 | 0 | 0 | 0 | 0 | 0 | 0 | 75 |
| 70 | 0 | 0 | 0 | 0 | 0 | 0 | 0 | 15 | 15 | 25 | 5 | 15 | 15 | 15 | 15 | 15 | 15 | 15 | 15 | 75 |
| 70 | 0 | 0 | 0 | 0 | 0 | 0 | -15 | 0 | -15 | -5 | -25 | -15 | -15 | -15 | -15 | -15 | -15 | -15 | -15 | 60 |
| 70 | 0 | 0 | 0 | 0 | 0 | 0 | 0 | 0 | 0 | 10 | -10 | 0 | 0 | 0 | 0 | 0 | 0 | 0 | 0 | 60 |
| 70 | 0 | 0 | 0 | 0 | 0 | 0 | 0 | 10 | 0 | 10 | 10 | 0 | 0 | 0 | 0 | 0 | 0 | 0 | 0 | 60 |
| 70 | 0 | 0 | 0 | 0 | 0 | 0 | 0 | -10 | -10 | 0 | -10 | 0 | 0 | 0 | 0 | 0 | 0 | 0 | 0 | 60 |
| 70 | 0 | 0 | 0 | 0 | 0 | 0 | 0 | 10 | -10 | 0 | 0 | 0 | 0 | 0 | 0 | 0 | 0 | 0 | 0 | 60 |
| 70 | -15 | -15 | -15 | -15 | -15 | -15 | -15 | 0 | -25 | -10 | 0 | -10 | 0 | 0 | 0 | 0 | 0 | 0 | 0 | 60 |
| 85 | 15 | 15 | 15 | 15 | 15 | 15 | 15 | 25 | 0 | 10 | 10 | 0 | 0 | 0 | 0 | 0 | 0 | 0 | 0 | 60 |
| 85 | 0 | 0 | 0 | 0 | 0 | 0 | 0 | 15 | -15 | 0 | 10 | -10 | 0 | 0 | 0 | 0 | 0 | 0 | 0 | 60 |
| 85 | -15 | -5 | -15 | -5 | 0 | -5 | 0 | -3 | -15 | -18 | -5 | -28 | -15 | -15 | -15 | -15 | -15 | -15 | -15 | 60 |
| 100 | 15 | 15 | 5 | 5 | 5 | 0 | 0 | 15 | 2.5 | 18 | 28 | 5 | 15 | 15 | 15 | 15 | 15 | 15 | 15 | 75 |
| 100 | 0 | 10 | -10 | 0 | 5 | -5 | 0 | -3 | 2.5 | 0 | 13 | -13 | 0 | 0 | 0 | 0 | 0 | 0 | 0 | 75 |
| 100 | 0 | 0 | -10 | -10 | 0 | -15 | -5 | -15 | -3 | -13 | -13 | -25 | -25 | -25 | -25 | -25 | -25 | -25 | -25 | 75 |
| 100 | 0 | 10 | 0 | 10 | 15 | 0 | 5 | 2.5 | 15 | 13 | 25 | 13 | 25 | 25 | 25 | 25 | 25 | 25 | 25 | 100 |
| 100 | 0 | 0 | 0 | 0 | 10 | -10 | 0 | -10 | 10 | 0 | 0 | 0 | 0 | 0 | 0 | 0 | 0 | 0 | 0 | 100 |
| 100 | 100 | 100 | 100 | 100 | 100 | 90 | 90 | 90 | 100 | 100 | 100 | 100 | 100 | 100 | 100 | 100 | 100 | 100 | 100 | 100 |

FIG.8C

|  |  |  |  |  |  |  |
|---|---|---|---|---|---|---|
|  | 25.98 | 30.00 | 37.75 | 39.05 | 46.37 |  |
|  | 0.00 | 18.03 | 23.45 | 34.28 | 25.98 |  |
|  | 25.98 | 23.45 | 32.02 | 14.14 | 0.00 |  |
|  | 30.41 | 36.49 | 32.88 | 36.14 | 25.98 |  |
|  | 20.00 | 27.04 | 39.37 | 50.06 | 50.50 |  |
|  |  |  |  |  |  |  |

20

PATTERN VERIFICATION METHOD, METHOD OF MANUFACTURING SEMICONDUCTOR DEVICE, AND RECORDING MEDIA

CROSS-REFERENCE TO RELATED APPLICATIONS

This application is based upon and claims the benefit of priority from prior Japanese Patent Application No. 2008-102381, filed on Apr. 10, 2008, the entire contents of which are incorporated herein by reference.

BACKGROUND

Recently, in accordance with miniaturization of a circuit pattern of a semiconductor device, a pattern size guarantee for a mask material such as a photo mask has been more important than ever.

Conventionally, the pattern size guarantee has been carried out by a method of drawing a drawing pattern to a mask substrate so as to form a photo mask and then deciding whether an average value and a variation amount of the pattern sizes measured at respective measuring points on the photo mask satisfy a predetermined pattern measurement specification or not. This method is, for example, disclosed in JP-A-2003-241364.

However, conventional mask size guarantee methods have disadvantages that a measurement time would be lengthened if the measurement points are set over the whole pattern in order to improve accuracy of the mask size guarantee.

BRIEF SUMMARY

A pattern verification method according to an embodiment includes, dividing a pattern data region or a pattern formation region formed based on the pattern data to a plurality of unit regions, calculating a pattern area ratio with respect to each unit region, calculating differences in the amount of the pattern area ratio between each unit region and adjacent unit regions thereto, setting the number or density of measurement point with respect to each unit region to the pattern of the pattern data region or the pattern formation region according to the difference in the amount of pattern area ratio, measuring the pattern size at each measurement point, and verifying whether the size measurement value is within a predetermined range or not.

A method of manufacturing a semiconductor device according to an embodiment includes, dividing a drawing pattern data region or a pattern formation region formed on a mask based on the drawing pattern data to a plurality of unit regions, calculating a pattern area ratio with respect to each unit region, calculating differences in the amount of the pattern area ratio between each unit region and adjacent unit regions thereto, setting the number or density of measurement points with respect to each unit region to the mask pattern of the pattern data region or the pattern formation region according to the difference in the amount of pattern area ratio, measuring the mask pattern size at each measurement point, verifying whether the size measurement value is within a predetermined range or not, and transfering the mask pattern onto a workpiece film by using a mask whose size measurement value is verified as being within the predetermined range.

A computer-readable recording media according to an embodiment includes, a computer program recorded thereon, wherein the computer program is configured to instruct a computer to execute steps of, dividing a pattern data region or a pattern formation region formed based on the pattern data to a plurality of unit regions, calculating a pattern area ratio with respect to each unit region, calculating differences in the amount of the pattern area ratio between each unit region and adjacent unit regions thereto, setting the number or density of measurement point with respect to each unit region to the pattern of the pattern data region or the pattern formation region according to the difference in the amount of pattern area ratio, inputting the pattern size at each measurement point, and verifying whether the size measurement value is within a predetermined range or not.

BRIEF DESCRIPTION OF THE DRAWING

FIG. 4 is an explanatory view schematically showing the mesh region divided into the region corresponding to the A part of FIG. 3.

FIGS. 5A to 5C are explanatory views schematically showing the method of obtaining the differences in the amount of the pattern area ratio with respect to each mesh region.

FIG. 6 is an explanatory view schematically showing the state that the differences in the amount (average values) of the pattern area ratio are recorded onto the respective mesh regions.

FIGS. 8A to 8C are explanatory views schematically showing the method of calculating the differences in the amount of the pattern area ratio about a logic product.

DETAILED DESCRIPTION

First Embodiment

Figure 1:
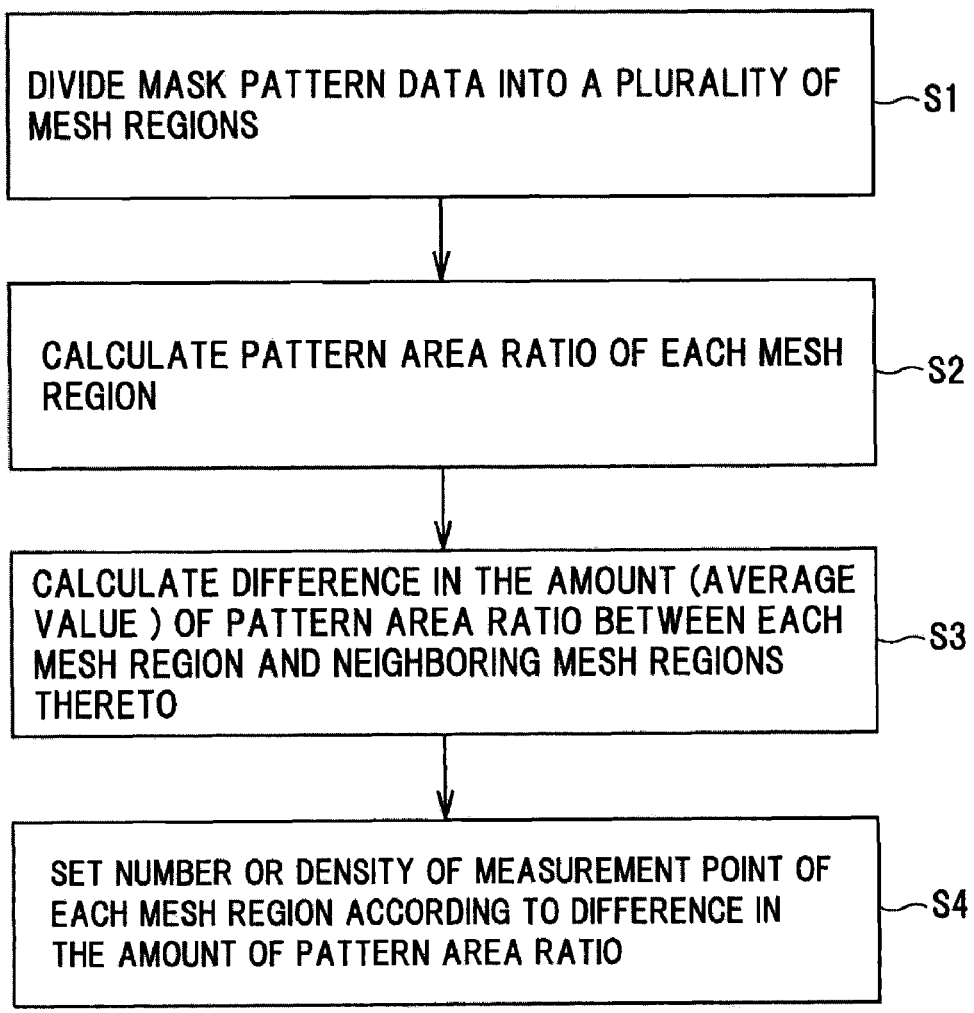
FIG. 1 is a flowchart showing the setting operation of the number of measurement point to which the pattern verification method according to the first embodiment are applied.
Figure 2:
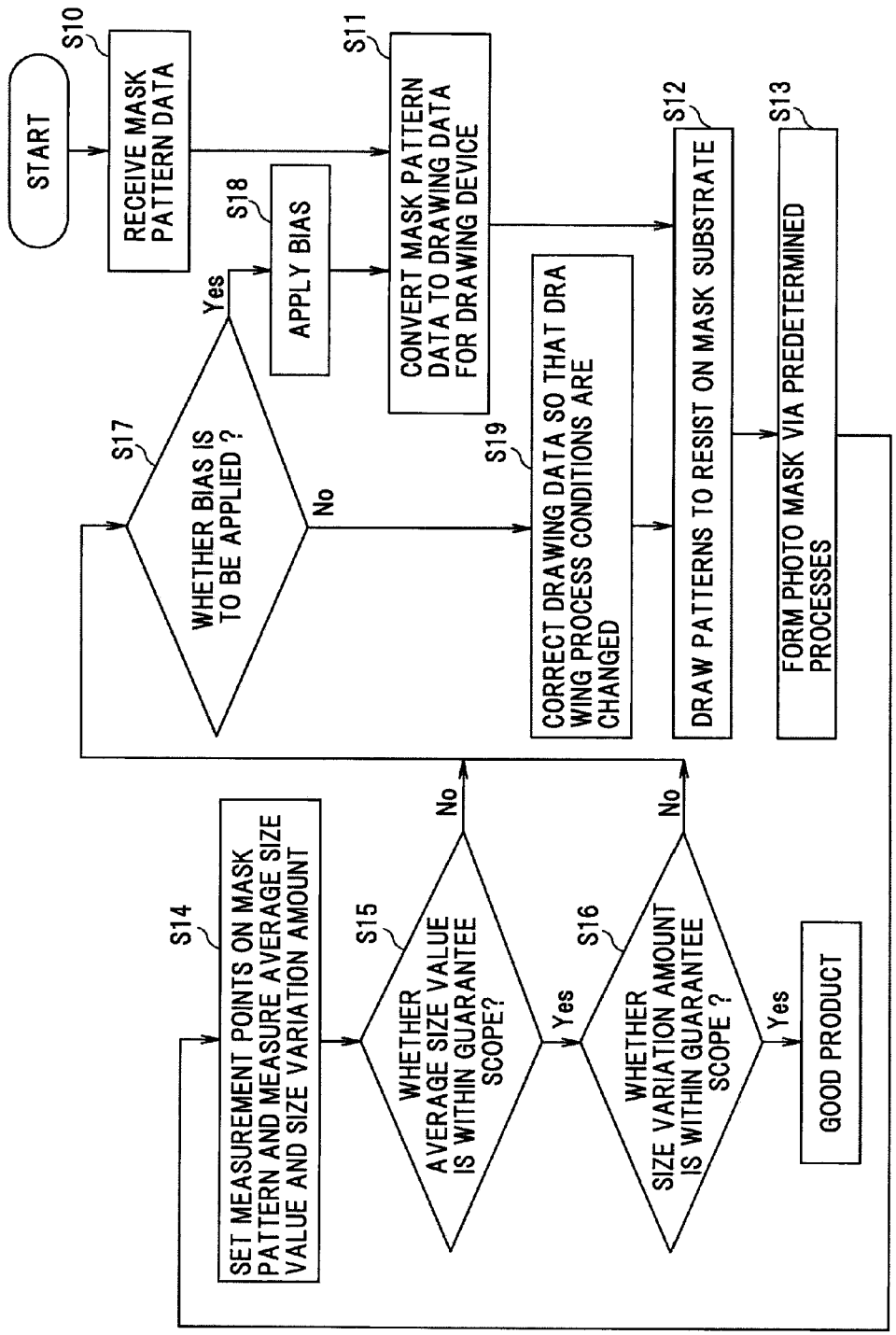
FIG. 2 is a flowchart showing the measurement operation of the photo mask to which the pattern verification method according to the first embodiment are applied.

FIG. 1 is a flowchart showing the setting operation of the number of measurement point to which the pattern verification method according to the first embodiment are applied. And, FIG. 2 is a flowchart showing the measurement operation of the photo mask to which the pattern verification method according to the first embodiment are applied.

In the present specification, the "pattern" as a measuring object means the patterns such as a mask pattern drawn in the photo mask, a mask pattern formed in a mask material such as a photo resist, a hard mask, and a wiring transcribed onto the workpiece member such as a semiconductor wafer.

(Setting Operation of Number of Measurement Point)

The setting operation of the number of measurement point will be explained according to the flowchart of FIG. 1 and with reference to FIG. 3, FIG. 4, FIG. 5A, FIG. 5B and FIG. 6.

Figure 3:
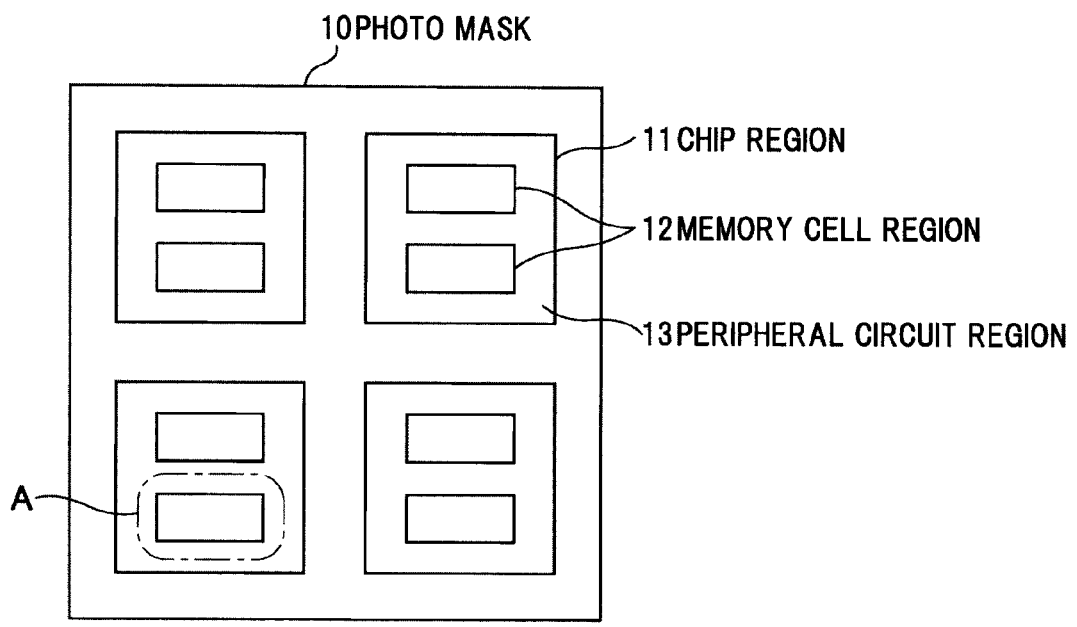
FIG. 3 is an explanatory view schematically showing one example of the photo mask.

FIG. 3 is an explanatory view schematically showing one example of the photo mask. The photo mask 10 shown in FIG. 3 includes, for example, four chip regions 11 having a rectangle shape. Each chip region 11 includes two memory cell regions 12 having a rectangle shape disposed in parallel with each other and a peripheral circuit region 13 formed on the periphery of the two memory cell regions 12, and is used for a memory product. Further, the photo mask 10 has a size of, for example, 26 mm in width, and 36 mm in length. If an exposure device of a reduced projection type is used, which is operable to expose by reducing the pattern size to quarter size, the pattern size of 200 μm on the photo mask is reduced to the size of 50 μm on the photo resist.

To begin with, the whole of the mask pattern data for manufacturing the photo mask 10 shown in FIG. 3 is divided into a plurality of mesh regions (unit regions) having a mesh shape (S1).

FIG. 4 is an explanatory view schematically showing the mesh region divided into the region corresponding to the A part of FIG. 3. After divided into the mesh regions, the pattern area ratio with respect to each mesh region 20 is calculated based on the mask pattern data, and is recorded onto the corresponding mesh region 20 (S2). The mesh region 20 has a size of, for example, 1 mm×1 mm. As the size and the divisional number of the mesh region, appropriate values are selected in view of the differences in the amount of the pattern area ratio mentioned below, the calculation time and the like, however, the mesh regions are needed to be not less than two.

Here, the "pattern area ratio" means a value obtained as the area of the drawing pattern region or the transcription pattern region in the region corresponding to the mesh region divided by the area of a single mesh region. The value of the pattern area ratio shown in each mesh region 20 of FIG. 4 is expressed in percentage, and FIG. 4 shows that the pattern area ratios are included within a range of 50 to 100%.

Next, the difference in the amount of pattern area ratio with respect to each mesh region is calculated (S3). Hereinafter, the calculation method of the difference in the amount of the pattern area ratio will be explained by using FIG. 5A, FIG. 5B and FIG. 6. The "difference in the amount of the pattern area ratio" means the difference in the amount of the pattern area ratio between the corresponding mesh region and adjacent mesh regions thereto.

FIGS. 5A to 5B are explanatory views schematically showing the method of obtaining the differences in the amount of the pattern area ratio with respect to each mesh region. After the pattern area ratios are calculated, each mesh region 20 is divided into 3×3 as shown in FIG. 5A, and differences in the amount of pattern area ratio between each corresponding mesh region 20 and adjacent mesh regions thereto are recorded onto each segment 21. Namely, as shown in FIG. 5B, the pattern area ratio of the noticed mesh region 20a (the shaded region in FIG. 5B) is defined as "a" and the pattern area ratios of the mesh regions 20b adjacent to the noticed mesh region 20a are defined as "b" to "i". As shown in FIG. 5C, the difference (a−a=0) in the amount between the pattern area ratio "a" and itself (pattern area ratio "a") is recorded onto the segment 21 located on the center of mesh region 20a, the difference (a−b) in the amount between the pattern area ratio "a" and the pattern area ratio "b" of the mesh region 20b adjacent to the upper side of noticed mesh region 20a is recorded onto the segment 21 located on the center and upper side of mesh region 20, with regard to the other mesh regions 20b the differences in the amount are similarly obtained and recorded onto the corresponding segments 21 of the mesh region 20. Further, the differences in the amount of pattern area ratios described in the mesh regions of FIG. 5A are not corresponding to the pattern area ratios described in the mesh regions of FIG. 4.

Next, the differences in the amount of pattern area ratio recorded onto the respective segments 21 of the mesh region 20 are averaged so as to calculate the difference in the amount of pattern area ratio (average value) of the mesh region 20 (S3). The differences in the amount of pattern area ratio (average values) with respect to each mesh region are calculated so that pattern area variation distributions per unit area are obtained with regard to the pattern region as a measurement object.

FIG. 6 is an explanatory view schematically showing the state that the differences in the amount (average values) of the pattern area ratio are recorded onto the respective mesh regions 20. The differences in the amount (average values) of the pattern area ratio obtained in the step S3 are recorded onto the mesh region 20. In FIG. 6, the shaded mesh region 20 represents the mesh region having the comparatively large difference in the amount (average value) of pattern area ratio.

Further, the above-mentioned records can be carried out on a memory such as a semiconductor memory, the records including the record of the pattern area ratio in the step (S2) of FIG. 4, the record of the difference in the amount of pattern area ratio in the step (S3) of FIGS. 5A to 5B, and the record of the difference in the amount (average value) of pattern area ratio of FIG. 6.

Next, the number or density of measurement point set to the patterns located on the unit region according to the difference in the amount of pattern area ratio is defined (S4). Concretely, the more the difference in the amount of pattern area ratio is large, the more the number or density of measurement point is increased. For example, the number of measurement point is set to four if the difference in the amount of pattern area ratio is not more than a first threshold value, the number is set to fifteen if the difference in the amount of pattern area ratio is between the first threshold value and a second threshold value, and the number is set to twenty if the difference in the amount of pattern area ratio is not less than the second threshold value. Further, it can be also adopted that the more the difference in the amount of pattern area ratio is large, the more the distance between the measurement points set to the patterns located on the unit region is decreased. Further, the number of threshold value is not limited to two, one or more than three can be also used. Furthermore, the number of measurement point etc. can be obtained by using a function or a table showing a relationship between the difference in the amount of pattern area ratio and the number of measurement point etc.

(Measurement Operation of Photo Mask)

Next, the measurement operation of the pattern formation region size of the photo mask will be explained according to the flowchart of FIG. 2. After the mask pattern data are received (S10), the mask pattern data are converted to the drawing data for an electron beam drawing device (S11). The drawing data can include a shot position by the electron beam (coordinates), number of times of the shot, an exposure amount of electron beam and the like.

Next, patterns are drawn to the resist on the mask substrate based on the drawing data (S12).

After that, the photo mask is formed via predetermined processes such as etching (S13).

The measurement points are set on the photo mask based on the number of measurement point set with respect to each mesh region at the step (S4) of FIG. 1, and the size average value and the size variation amount of the mask pattern are measured (S14).

The measured average size value is determined whether it is within the corresponding guarantee range or not (S15), and the size variation amount is determined whether it is within the corresponding guarantee range or not (S16). If each of the measurement values is within the guarantee range in the steps (S15) and (S16), the photo mask is determined as a good product. Further, the guarantee value can be set so as to be different with respect to each mesh region.

If the average size value is determined to be not within the corresponding guarantee range (S15: No), or the size variation amount is determined to be not within the corresponding guarantee range (S16: No), it is determined whether the application of bias is necessary or not (S17), and if the application of bias is determined to be necessary (S17: Yes), the bias is applied to the mask pattern data (S18).

If the average size value is determined to be not within the corresponding guarantee range (S15: No), or the size variation amount is determined to be not within the corresponding guarantee range (S16: No), and if the application of bias is determined to be not necessary or if the pattern drawing and the transcription can not be carried out appropriately due to the application of bias since the distance between the adjacent patterns is too short (S17: No), the correction of irradiance level of electron beam is carried out, the correction including a step of correcting the drawing data so as to change the drawing process conditions such as the irradiance level of electron beam, the irradiance position of electron beam (S19).

In the above-mentioned step (S18), after the bias is applied to the mask pattern data, the operations of step (S11) to step (S19) described above are repeated until the measurement values of the average size value and the size variation amount become within the corresponding guarantee range.

In the above-mentioned step (S19), after the correction of drawing process is carried out, the operations of (S12) to (S16) described above are repeated until the measurement values of the average size value and the size variation amount become within the corresponding guarantee range.

Further, the flowchart of FIG. 2 shows that either the bias correction or the correction of drawing process is carried out, but both the corrections can be carried out.

Advantages of Embodiment

Figure 7A:
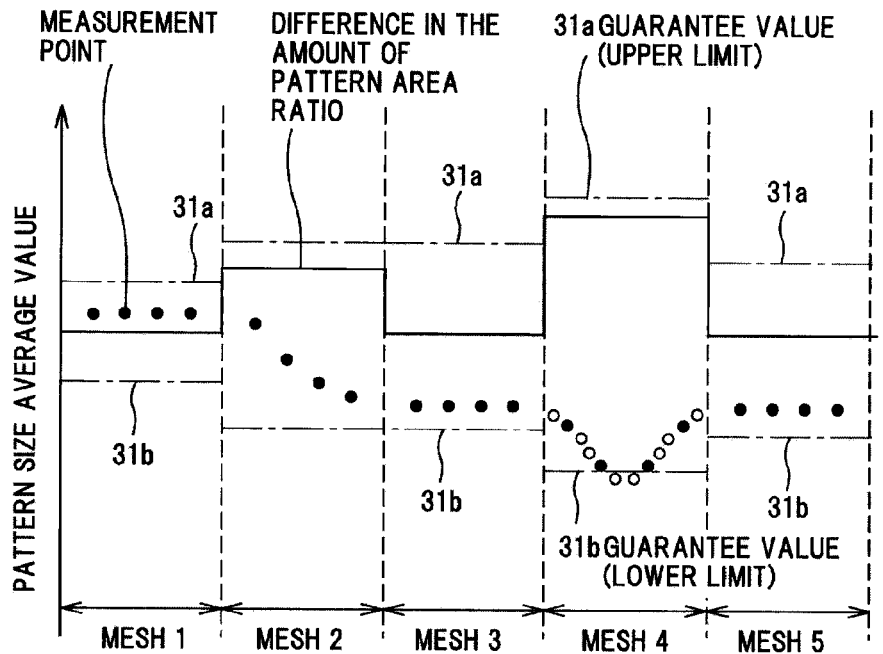
FIG. 7A is an explanatory view schematically showing one example of the pattern size distribution in the sequential mesh regions and the measurement values in case of setting the measurement points based on conventional technologies.
Figure 7B:
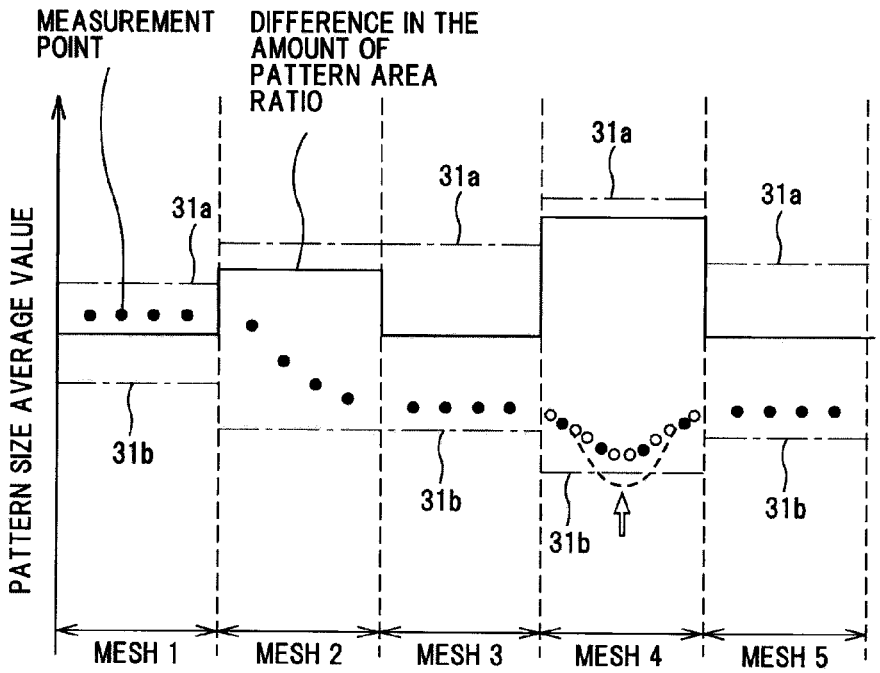
FIG. 7B is an explanatory view schematically showing one example of the pattern size distribution in the sequential mesh regions and the measurement values in case of setting the measurement points based on the present embodiment.

FIGS. 7A to 7B respectively show one example of the pattern size average value in the sequential mesh regions and the guarantee range, FIG. 7A shows the pattern size average value in case of setting the measurement points based on conventional technologies, and FIG. 7B shows the pattern size average value in case of setting the measurement points based on the present embodiment. In FIGS. 7A to 7B, the filled circles show the measurement points located on each mesh region as conventional technologies, and the open circles show the measurement points added based on the present embodiment. Further, the range from the guarantee value (upper limit) $31a$ to the guarantee value (lower limit) $31b$ is defined as the guarantee range. FIG. 7A shows that the pattern size average values of the mesh 4 of the sequential mesh regions shown as from the mesh 1 to the mesh 5 become smaller than the guarantee value (lower limit) $31b$, and that the region becomes a faulty place. Since the difference in the amount of pattern area ratio of the mesh 4 becomes larger than the threshold value (not shown), with respect to the mesh 4, the number of measurement point is increased than those of the other meshes. As described above, such correction technologies as the correction applying the bias to the mask pattern data, or the correction changing the mask drawing conditions at the drawing process are carried out, so that as shown in FIG. 7B the pattern size average value of the mesh 4 can be maintained within the guarantee range.

In FIGS. 7A to 7B, the pattern size average value has been explained, but similarly to the pattern size variation amount (for example, error from the pattern design size), the above-mentioned steps can be adopted and the pattern size value of the mesh region of the faulty place can be maintained within the guarantee range, the steps including a step of setting the number of measurement point according to the difference in the amount of pattern area ratio and a step of carrying out such correction technologies as the correction applying the bias to the mask pattern data, or the correction changing the mask drawing conditions at the drawing process.

The mask pattern size variation includes a random variation component and a systematic variation component (a systematic error). The systematic error tends to occur in the mesh region where the pattern area fluctuates. This is due to the fact that the drawing process, the development process and the etching process are susceptible to a local difference in the amount of pattern area ratio. Further, the systematic error of the pattern size is reduced on the region where the pattern area does not fluctuate. If there is a systematic error distribution in the pattern surface, the size average value and the size variation amount fluctuate according to the locations of the measurement points of the pattern size so that the locations of the measurement points for monitoring the worst value become important, but it is difficult to monitor the worst value if the number of measurement point is small. Consequently, as shown in the present embodiment, the measurement points are located in the high density on the mesh regions where the difference in the amount of pattern area ratio is large, so that the worst value of the size variation amount according to the systematic error can be monitored, the worst value can be reflected to the guarantee determination, and the guarantee accuracy of the mask pattern size can be enhanced. Further, the number of measurement point is partially increased on the necessary mesh regions so that the measurement time can be shortened in comparison with the case of wholly increasing the number of measurement point.

FIGS. 8A to 8C are explanatory views schematically showing the method of calculating the differences in the amount of the pattern area ratio about a logic product. The pattern area ratios are calculated with respect to each mesh region, and as shown in FIG. 8A, the pattern area ratios are recorded onto the mesh regions. Next, as shown in FIG. 8B, the differences in the amount of pattern area ratio between each mesh region and adjacent mesh regions thereto are calculated and recorded onto the corresponding segments in the mesh regions. Next, the average values of the differences in the amount of pattern area ratio in the mesh regions are obtained, and as shown in FIG. 8C, the average values are recorded onto the mesh regions. In FIG. 8C, the shaded mesh region 20 represents the mesh region having the comparatively large difference in the amount (average value) of pattern area ratio.

Second Embodiment

Figure 9:
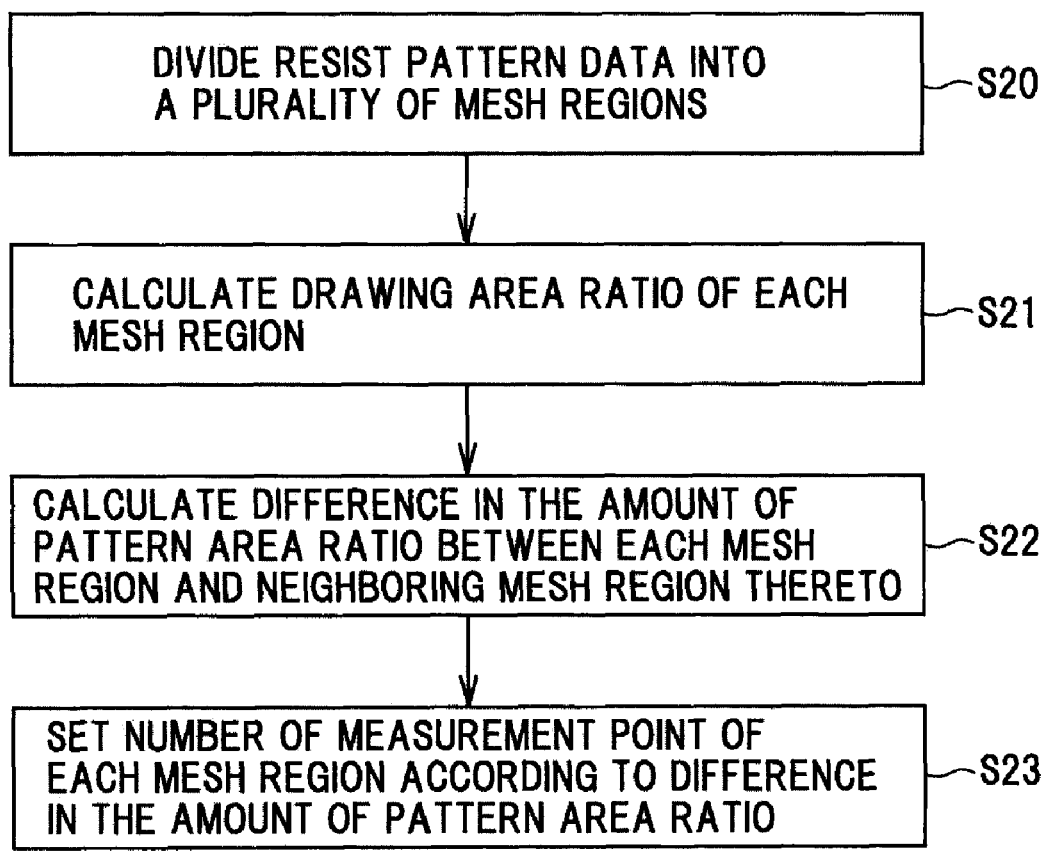
FIG. 9 is a flowchart showing the method of guaranteeing the resist pattern to which the pattern verification method according to the second embodiment are applied.

FIG. 9 is a flowchart showing the method of guaranteeing the resist pattern to which the pattern verification method according to the second embodiment are applied.

To begin with, the whole of the resist pattern data is divided into a plurality of mesh regions (unit regions) having a mesh shape (S20).

Next, the pattern area ratio with respect to each mesh region is calculated based on the resist pattern data (S21). Here, the "pattern area ratio" means a value obtained as the area of the resist film divided by the area of a single mesh region.

Next, similarly to the first embodiment, the differences in the amount of pattern area ratio between each mesh region and adjacent mesh regions thereto are recorded onto each corresponding segment. And, the differences in the amount of pattern area ratio recorded onto the respective segments of the mesh region are averaged so as to calculate the difference in the amount of pattern area ratio (average value) of the mesh region (S22).

Next, similarly to the first embodiment, the number of measurement point is defined according to the difference in the amount of pattern area ratio (S23). Concretely, the more the difference in the amount of pattern area ratio is large, the more the number or density of measurement point is increased.

According to the present embodiment, the measurement points are located in the high density on the mesh regions where the difference amount of pattern area ratio is large, so that the worst value of the size variation amount according to the systematic error can be monitored, the worst value can be reflected to the guarantee determination, and the guarantee accuracy of the mask pattern size can be enhanced.

Third Embodiment

The method of manufacturing a semiconductor device according to the third embodiment includes transfering the mask pattern on the photo mask which is guaranteed by the pattern verification method according to the first embodiment onto a photoresist on a wafer of semiconductor, forming a photoresist pattern by developing the photoresist, carrying out an etching by using the photoresist pattern as a mask, and forming patterns on the wafer of semiconductor. A semiconductor device can be fabricated by repeating the above-mentioned operations.

Further, when the photoresist pattern is formed on the photoresist, after it is guaranteed by the pattern verification method of resist pattern according to the second embodiment, the patterns can be formed on the wafer of semiconductor by carrying out the etching by using the photoresist pattern as a mask.

Fourth Embodiment

Figure 10:
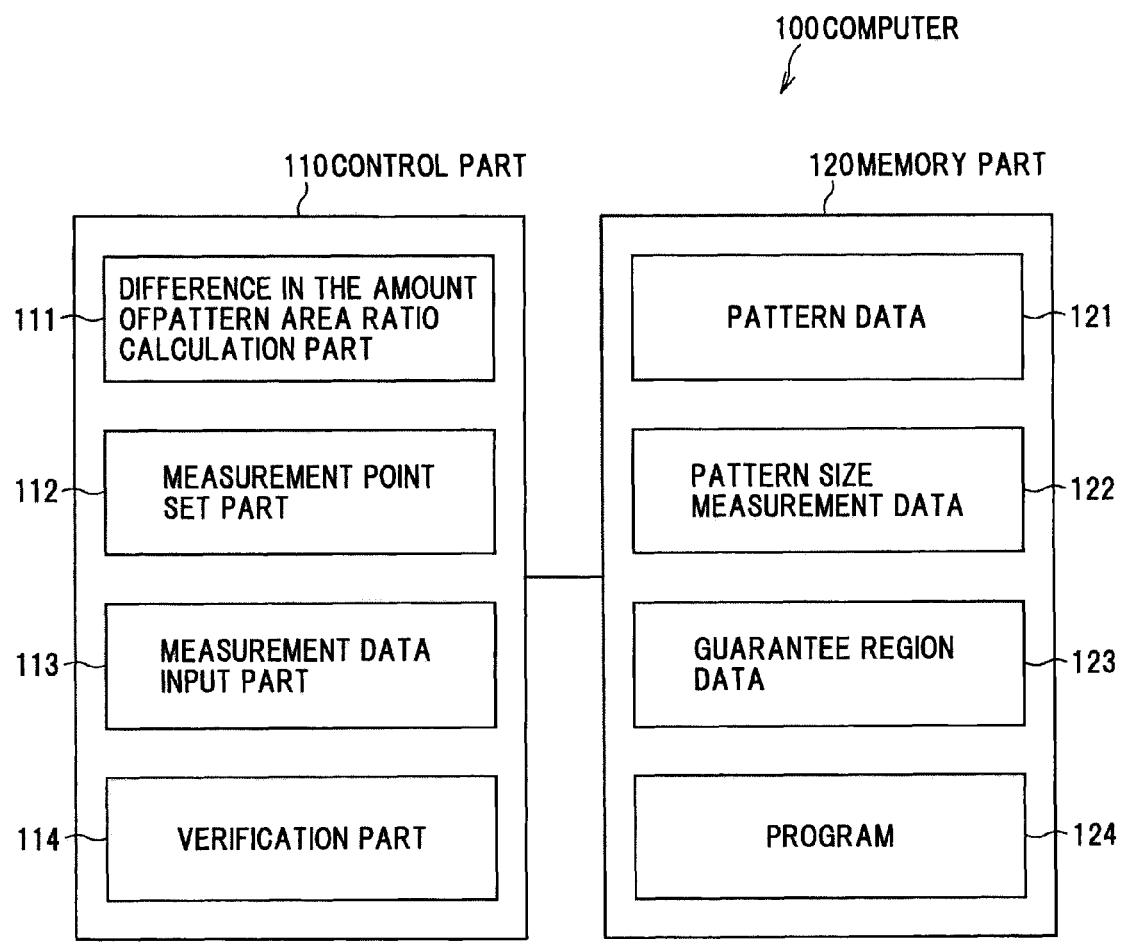
FIG. 10 is a block diagram showing the configuration of the computer according to the fourth embodiment.

FIG. 10 is a block diagram showing the configuration of the computer according to the fourth embodiment. The computer 100 includes a control part 110 composed of a CPU etc., and a memory part 120 composed of a ROM, a RAM, a HDD etc. The CPU of the control part 110 functions as a difference in the amount of pattern area ratio calculation part 111, a measurement point set part 112, a measurement data input part 113, a verification part 114 and the like by operating according to a program 124 stored on the memory part 120. The memory part 120 stores pattern data 121, pattern size measurement data 122, and guarantee region data 123 other than the program 124. The program 124 is configured to instruct the CPU of the control part 110 of the computer 100 to execute the flowcharts shown in FIGS. 1 to 2, or FIG. 9. The program 124 can be provided in a state of being recorded in the computer 100 readable recording media, and can be provided by being downloaded from a server via a network such as the internet. The difference in the amount of pattern area ratio calculation part 111 divides the region of pattern data 121 or the pattern formation region formed based on the pattern data 121 to a plurality of unit regions, calculates the pattern area ratio with respect to each unit region, and calculates the differences in the amount of the pattern area ratio between each unit region and adjacent unit regions thereto. The measurement point set part 112 sets the number or density of measurement point with respect to each unit region to the pattern of the pattern data region or the pattern formation region according to the difference in the amount of pattern area ratio. The measurement data input part 113 inputs the pattern size measurement data 122 obtained by measuring at the measurement points set by the measurement point set part 112 to the memory part 120 so that the memory part 120 stores the data 122. The verification part 114 verifies whether the pattern size measurement data 122 are kept within the guarantee region data 123 or not.

Further, it should be noted that the present invention is not intended to be limited to the above-mentioned first to fourth embodiments, and the various kinds of changes thereof can be implemented by those skilled in the art without departing from the gist of the invention. Furthermore, it is possible to arbitrarily combine the configurations of the above-mentioned first to fourth embodiments without departing from the gist of the invention.

For example, the above-mentioned embodiments show that the size of mesh region is maintained constant and the number of measurement point is changed according to the pattern area ratio variation distribution, but it can be also adopted that the number of measurement point is maintained constant and the size of mesh region is changed according to the pattern area ratio variation distribution. Further, the number of measurement point can be changed with respect to each region of semiconductor device. For example, the number or density of measurement point set to the memory cell region can be more or larger than that set to the peripheral circuit region formed at the periphery of the memory cell region.

Further, the above-mentioned embodiments show that the mask pattern data or the resist pattern data are divided into the mesh regions, but it can be also adopted that after the mask pattern or the resist film actually formed on the mask substrate or the pattern formed on the semiconductor substrate is obtained as image data, the image data are divided into the mesh regions.

Furthermore, the above-mentioned embodiments show that as a result of the verification of the patterns formed on the mask substrate, if the pattern average size value or the pattern size variation is not within the guarantee range, the change of the patterns to be drawn onto the mask substrate or the change of drawing process conditions is carried out, but it can be also adopted that as a result of the verification of the patterns formed on the semiconductor substrate, if the pattern average size value or the pattern size variation is not within the guarantee range, change of the design patterns (target patterns) to be transcribed onto the semiconductor substrate or change of the conditions of pattern transcription process to the semiconductor substrate, such as an exposure condition, a bake condition, a development condition, an etching condition is carried out.

What is claimed is:

1. A computer-implemented pattern verification method comprising:

dividing, by a computer, a pattern formation region of a photomask formed based on pattern data into a plurality of unit regions;

calculating, by a computer, a pattern area ratio for each unit region;

calculating, by a computer, a difference in the pattern area ratio between each unit region and adjacent unit regions adjacent thereto;

setting, by a computer, the number or density of measurement points for each unit region according to the difference in the pattern area ratio of the corresponding unit region;

measuring a pattern size at each measurement point;

calculating size measurement values for each unit region based on the pattern sizes measured at the measurement points within the corresponding unit region; and verifying whether each of the size measurement values is within a predetermined range.

2. The pattern verification method according to claim 1, wherein calculating the difference in the pattern area ratio comprises:

calculating a plurality of differences in the pattern area ratio between each unit region and a plurality of unit regions adjacent thereto; and calculating an average value of the plurality of differences as the difference in the pattern area ratio of the corresponding unit region.

3. The pattern verification method according to claim 1, wherein calculating the size measurement values for each unit region comprises calculating an average value of the measured pattern sizes and a variation amount of the measured pattern sizes in the corresponding unit region, and wherein verifying whether each of the size measurement values is within a predetermined range comprises verifying whether the average value and the variation amount are respectively within a corresponding predetermined range.

4. The pattern verification method according to claim 1, wherein the plurality of unit regions include a first unit region and a second unit region, the first unit region having a larger pattern area ratio than the second unit region, and the number or density of measurement points set for the first unit region is larger than that set for the second unit region.

5. The pattern verification method according to claim 4, wherein the first unit region is a memory cell region of a semiconductor device, and the second unit region is a peripheral circuit region formed to the periphery of the memory cell region.

6. The pattern verification method according to claim 1, wherein a resist pattern data region or a resist pattern formation region formed based on the resist pattern data is divided into a plurality of the unit regions, the pattern area ratio with respect to each unit region is calculated, the differences in the amount of the pattern area ratio between each unit region and the adjacent unit regions thereto are calculated, the number or density of measurement point with respect to each unit region to the resist pattern of the pattern data region or the pattern formation region according to the difference in the amount of pattern area ratio is set, and the resist pattern size at each measurement point is measured.

7. The pattern verification method according to claim 1, further comprising:

if one of the size measurement values is not within the corresponding predetermined range, changing the pattern data or process conditions for pattern formation.

8. A method of manufacturing a semiconductor device comprising:

performing a pattern verification on a mask pattern of a photomask, comprising:

dividing a pattern formation region of the photomask formed based on pattern data into a plurality of unit regions;

calculating a pattern area ratio for each unit region;

calculating a difference in the pattern area ratio between each unit region and adjacent unit regions adjacent thereto;

setting the number or density of measurement points for each unit region according to the difference in the pattern area ratio of the corresponding unit region;

measuring a pattern size at each measurement point;

calculating size measurement values for each unit region based on the pattern sizes measured at the measurement points within the corresponding unit region; and verifying whether each of the size measurement values is within a predetermined range; and transferring the mask pattern onto a workpiece film by using the photomask.

9. The method of manufacturing a semiconductor device according to claim 8, wherein calculating the difference in the pattern area ratio comprises:

calculating a plurality of differences in the pattern area ratio between each unit region and a plurality of unit regions adjacent thereto; and calculating an average value of the plurality of differences as the difference in the pattern area ratio of the corresponding unit region.

10. The method of manufacturing a semiconductor device according to claim 8, wherein calculating the size measurement values for each unit region comprises calculating an average value of the measured pattern sizes and a variation amount of the measured pattern sizes, and wherein verifying whether each of the size measurement values is within a predetermined range comprises verifying whether the average size value and the variation amount are respectively within a corresponding predetermined range.

11. The method of manufacturing a semiconductor device according to claim 10, further comprising:

if one of the average size value and the variation amount is not within the corresponding predetermined range, biasing data for the mask pattern or changing drawing data for forming the mask pattern.

12. The method of manufacturing a semiconductor device according to claim 8, wherein the plurality of unit regions include a first unit region and a second unit region, the first unit region having a larger pattern area ratio than the second unit region, and the number or density of measurement points set for the first unit region is larger than that set for the second unit region.

13. The method of manufacturing a semiconductor device according to claim 12, wherein the first unit region is a memory cell region, and the second unit region is a peripheral circuit region.

14. The method of manufacturing a semiconductor device according to claim 8, further comprising:

if one of the measurement values is verified as being not within the corresponding predetermined range, changing data for drawing pattern or drawing process conditions for formation of the mask pattern.

15. The method of manufacturing a semiconductor device according to claim 8, further comprising:

if one of the measurement values is verified as being not within the corresponding predetermined range, changing a design pattern data to become a base of drawing pattern data or pattern transcription process conditions at the transcription of the mask pattern onto the workpiece.

16. A non-transitory computer-readable recording medium storing a computer program, which, when executed, causes a computer to perform a pattern verification, the pattern verification comprising:
dividing a pattern formation region of a photomask formed based on pattern data into a plurality of unit regions;
calculating a pattern area ratio for each unit region;
calculating a difference in the pattern area ratio between each unit region and adjacent unit regions adjacent thereto;
setting the number or density of measurement points for each unit region according to the difference in the pattern area ratio of the corresponding unit region;
measuring a pattern size at each measurement point;
calculating size measurement values for each unit region based on the pattern sizes measured at the measurement points within the corresponding unit region; and
verifying whether each of the size measurement values is within a predetermined range.

17. The computer-readable recording medium according to claim 16, wherein calculating the difference in the pattern area ratio comprises:
calculating a plurality of differences in the pattern area ratio between each unit region and a plurality of unit regions adjacent thereto; and
calculating an average value of the plurality of differences as the difference in the pattern area ratio of the corresponding unit region.

18. The computer-readable recording medium according to claim 16,
wherein calculating the size measurement values for each unit region comprises calculating an average value of the measured pattern sizes and a variation amount of the measured pattern sizes in the corresponding unit region, and
wherein verifying whether each of the size measurement values is within a predetermined range comprises verifying whether the average value of the pattern and the variation amount are respectively within a corresponding predetermined range.

19. The computer-readable recording medium according to claim 16, wherein the plurality of unit regions include a first unit region and a second unit region, the first unit region having a larger pattern area ratio than the second unit region, and the number or density of measurement points set for the first unit region is larger than that set for the second unit region.

20. The computer-readable recording medium according to claim 16, wherein the verification further comprises:
if one of the size measurement values is not within the corresponding predetermined range, changing the pattern data or process conditions for pattern formation.

* * * * *